United States Patent
Jang et al.

(10) Patent No.: US 11,764,757 B2
(45) Date of Patent: Sep. 19, 2023

(54) DEVICE AND METHOD FOR FILTERING SIGNAL

(71) Applicant: AGENCY FOR DEFENSE DEVELOPMENT, Daejeon (KR)

(72) Inventors: Yeonsoo Jang, Daejeon (KR); Jintae Park, Daejeon (KR); Beomjun Park, Daejeon (KR); Insun Kim, Daejeon (KR); Ghiback Kim, Daejeon (KR)

(73) Assignee: AGENCY FOR DEFENSE DEVELOPMENT, Daejeon (KR)

( * ) Notice: Subject to any disclaimer, the term of this patent is extended or adjusted under 35 U.S.C. 154(b) by 177 days.

(21) Appl. No.: 17/171,757

(22) Filed: Feb. 9, 2021

(65) Prior Publication Data

US 2021/0250017 A1   Aug. 12, 2021

(30) Foreign Application Priority Data

Feb. 12, 2020   (KR) .......................... 10-2020-0017038

(51) Int. Cl.
*H03H 17/02*   (2006.01)
(52) U.S. Cl.
CPC .... *H03H 17/0213* (2013.01); *H03H 17/0266* (2013.01)
(58) Field of Classification Search
CPC ................... H03H 17/0266; H03H 17/0267
See application file for complete search history.

(56) References Cited

U.S. PATENT DOCUMENTS

| | | | | |
|---|---|---|---|---|
| 6,356,569 B1* | 3/2002 | Sonalkar | ............ | H03H 17/0266 |
| | | | | 370/545 |
| 10,044,488 B1* | 8/2018 | Tsai | ...................... | H04L 5/0085 |
| 2004/0042557 A1* | 3/2004 | Kabel | ................... | H04B 1/406 |
| | | | | 375/260 |
| 2007/0027679 A1* | 2/2007 | Mansour | ............ | H03H 17/0266 |
| | | | | 704/203 |

\* cited by examiner

*Primary Examiner* — Michael D. Yaary
(74) *Attorney, Agent, or Firm* — Knobbe, Martens, Olson & Bear, LLP

(57) ABSTRACT

This application relates to a signal filtering device. The device includes a memory and a processor. The processor may generate one or more matrices based on a size of a digital filter bank that generates an output signal by dividing an input signal into a plurality of channels and store in the memory each of the generated one or more matrices to which a plurality of digital filter bank coefficients or a plurality of input signals are assigned. The processor may also partially calculate the stored plurality of digital filter bank coefficients and the plurality of signals based on a number of at least some of the plurality of channels, and calculate the calculated digital filter bank coefficients and signals. The processor may further perform a discrete Fourier transform (DFT) on the calculated signal and compensate for a phase of the discrete Fourier transformed signal according to a preset reference.

19 Claims, 9 Drawing Sheets

… (1)

DEVICE AND METHOD FOR FILTERING SIGNAL

CROSS-REFERENCE TO RELATED APPLICATION

This application claims priority to Korean Patent Application No. 10-2020-0017038, filed on Feb. 12, 2020. The entire contents of the application on which the priority is based are incorporated herein by reference.

TECHNICAL FIELD

The present disclosure relates to a signal filtering device and a signal filtering method, and more particularly, to a device and method for filtering a signal based on a digital filter bank.

BACKGROUND

In general, digital filter banks perform a function of dividing a wideband input signal into narrowband channels and converting the wideband input signal into a baseband, and may obtain advantages such as improvement in reception sensitivity and reduction in a digital processing speed by reducing a processing bandwidth therethrough.

In the generally used digital filter bank, an input signal passes through an analog-to-digital converter (ADC) to be converted into a digital signal, and then the digital filter bank receives the converted digital signal, and moves each of the digital signals to the baseband by multiplying a continuous wave corresponding to a center frequency of each channel of the digital signal. In this case, the signal moved to the baseband passes through a low pass filter (LPF) and then a signal with a reduced sample rate is output to each of the plurality of channels through a down sampling process.

SUMMARY

One aspect is a signal filtering device and a signal filtering method.

Another aspect is a signal filtering device that reduces the complexity of implementation of a digital filter bank due to a relatively small amount of signal calculation through such a device and method and that prevents an aliasing phenomenon from occurring due to a variable sample rate.

Another aspect is a signal filtering device, comprising a memory and a processor configured to generate one or more matrices based on a size of a digital filter bank that generates an output signal by dividing an input signal into a plurality of channels, store in the memory each of the generated one or more matrices to which a plurality of digital filter bank coefficients or a plurality of input signals are assigned, calculate the stored plurality of digital filter bank coefficients and the plurality of signals based on a number of at least some of the plurality of channels, and calculating the calculated digital filter bank coefficients and signals, perform a discrete Fourier transform (DFT) on the calculated signal; and compensate for a phase of the discrete Fourier transformed signal according to a preset reference.

Also the processor is further configured to generate a first matrix and a second matrix having first data as a column and second data as a row, which is a value obtained by dividing a length of the digital filter bank by the first data.

Also the processor is further configured to generate a first matrix and a second matrix having first data as a column and second data as a row, which is a value obtained by dividing a length of the digital filter bank by the first data.

Also the memory stores the first matrix to which the plurality of digital filter bank coefficients are assigned and the second matrix to which the plurality of signals are assigned.

Also the operation performed by the processor is further configured to comprise an operation of adding a value obtained by multiplying each of some of the plurality of digital filter bank coefficients stored in the first matrix and some of the plurality of signals stored in the second matrix based on the number of channels.

Also the processor is further configured to generate the calculated signal as much as the number of channels.

Also the discrete Fourier transform performs a fast Fourier transform (FFT).

Also the processor is further configured to compensate for a phase of the discrete Fourier transformed signal based on the product of the discrete Fourier transformed signal and $\exp(-j2\pi \cdot i \cdot U/W)$, the i is a channel number of the discrete Fourier transformed signal, the U is the first data, and the W is the number of channels.

Also a sample rate for adjusting a bandwidth of the output signal is adjusted according to a value of the first data.

Another aspect is a method of filtering a signal, comprising generating one or more matrices based on a size of a digital filter bank that generates an output signal by dividing an input signal into a plurality of channels, storing each of the generated one or more matrices to which a plurality of digital filter bank coefficients or a plurality of input signals are assigned, partially calculating the stored plurality of digital filter bank coefficients and the plurality of signals based on the number of at least some channels of the plurality of channels, and calculating the calculated digital filter bank coefficients and signals, performing a Discrete Fourier Transform (DFT) on the calculated signal and compensating for a phase of the discrete Fourier transformed signal according to a preset reference.

Another aspect is a non-transitory computer readable recording medium storing a computer program, wherein the computer program, when executed by a processor, comprises instructions for enabling the processor to perform a method of filtering a signal, the method comprising generating one or more matrices based on a size of a digital filter bank that generates an output signal by dividing an input signal into a plurality of channels, storing each of the generated one or more matrices to which a plurality of digital filter bank coefficients or a plurality of input signals are assigned, partially calculating the stored plurality of digital filter bank coefficients and the plurality of signals based on the number of at least some channels of the plurality of channels, and calculating the calculated digital filter bank coefficients and signals performing a Discrete Fourier Transform (DFT) on the calculated signal and compensating for a phase of the discrete Fourier transformed signal according to a preset reference.

DETAILED DESCRIPTION

In the case of a general digital filter bank, it may be implemented so that an aliasing phenomenon that occurs at a channel boundary does not occur through adjustment of a filter coefficient and a sample rate reduction coefficient, but there was a problem in that because a signal calculation process is relatively much consumed, it is complicated to implement the digital filter bank.

For this reason, polyphase filter banks have been proposed to reduce an amount of calculation of a general digital filter bank structure, and these polyphase filter banks may be implemented with simplified filter calculation and Fast Fourier Transform (FFT) due to regularity when performing frequency equal interval channelization with the number of channels that are multiples of 2.

Such a polyphase filter bank has an advantage of having a smaller amount of signal calculation than that of a general digital filter bank, but because a sample rate is preset, an aliasing phenomenon may occur due to a fixed sample rate.

Accordingly, there is a need for technology that prevents an aliasing phenomenon from occurring while having a smaller amount of signal calculation than that of a general digital filter bank.

The advantages and features of the embodiments and the methods of accomplishing the embodiments will be clearly understood from the following description taken in conjunction with the accompanying drawings. However, embodiments are not limited to those embodiments described, as embodiments may be implemented in various forms. It should be noted that the present embodiments are provided to make a full disclosure and also to allow those skilled in the art to know the full range of the embodiments. Therefore, the embodiments are to be defined only by the scope of the appended claims.

In describing the embodiments of the present disclosure, if it is determined that detailed description of related known components or functions unnecessarily obscures the gist of the present disclosure, the detailed description thereof will be omitted. Further, the terminologies to be described below are defined in consideration of the functions of the embodiments of the present disclosure and may vary depending on a user's or an operator's intention or practice. Accordingly, the definition thereof may be made on a basis of the content throughout the specification.

Figure 1:
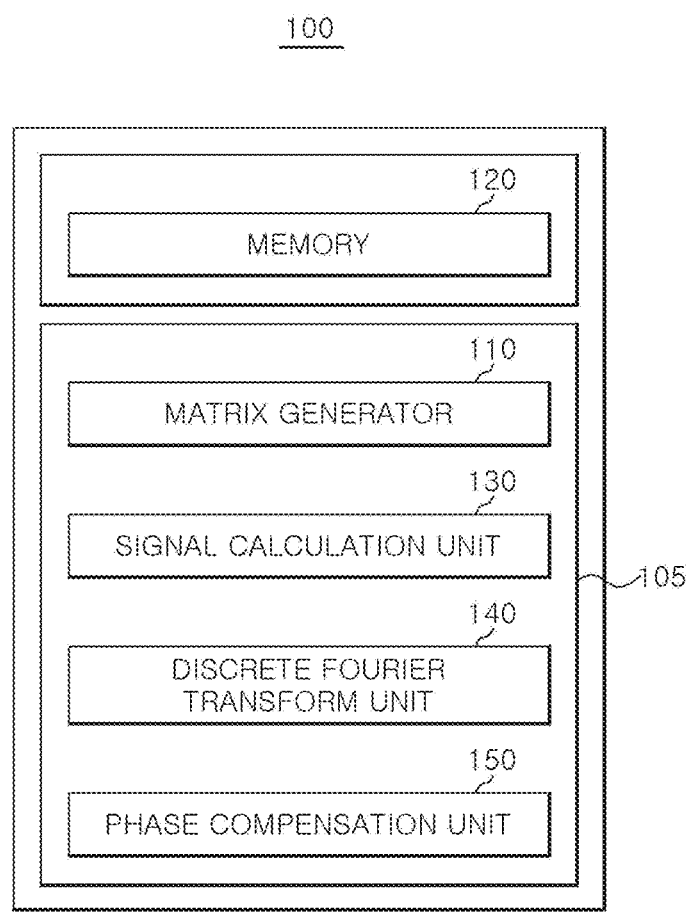
FIG. 1 describes a block diagram of a signal filtering device according to an embodiment.

FIG. 1 is a block diagram of a signal filtering device 100 according to an embodiment.

Referring to FIG. 1, the signal filtering device 100 according to an embodiment may include a matrix generator 110, a memory 120, a signal calculation unit 130, a discrete Fourier transform unit 140, and a phase compensation unit 150, but the present disclosure is not limited thereto. Further, each of the components included in the signal filtering device 100 may be implemented in the form of a software module or a hardware module, or a combination of a software module and a hardware module, for example, in a computer or a smart device, and each of the components may be electrically connected. The matrix generator 110, a memory 120, a signal calculation unit 130, a discrete Fourier transform unit 140, and a phase compensation unit 150 may be embodied by at least one processor 105 or microcontroller.

The signal filtering device 100 according to an embodiment may operate as digital G filter banks that generate an output signal by dividing an input signal into a plurality of channels, but the present disclosure is not limited thereto.

The matrix generator 110 may generate one or more matrices based on a size of the digital filter bank.

In this case, the matrix generator 110 may generate a first matrix and a second matrix having first data U as a column and second data L/U as a row, which is a value obtained by dividing a length L of the digital filter bank by the first data U, but the present disclosure is not limited thereto and may generate two or more matrices.

Here, the first data U is a variable (e.g., may be a random natural number) that can change a sample rate of the signal filtering device 100, and a sample rate of the signal filtering device 100 is changed according to a first data value, and as the sample rate is changed, a bandwidth of the signal filtering device 100 may be changed, but the present disclosure is not limited thereto.

Further, the length L of the digital filter bank may be the number of entire data that can be stored in a matrix generated in the matrix generator 110, and for example, when the first data U of the matrix generated in the matrix generator 110 is 6 and the length of the digital filter bank L, that is, the number of entire data that can be stored in the matrix generated in the matrix generator 110 is 30, the second data L/U may be 5 (30/6).

Hereinafter, the generation of one or more matrices by the matrix generator 110 will be described in detail with reference to FIG. 2.

Figure 2:
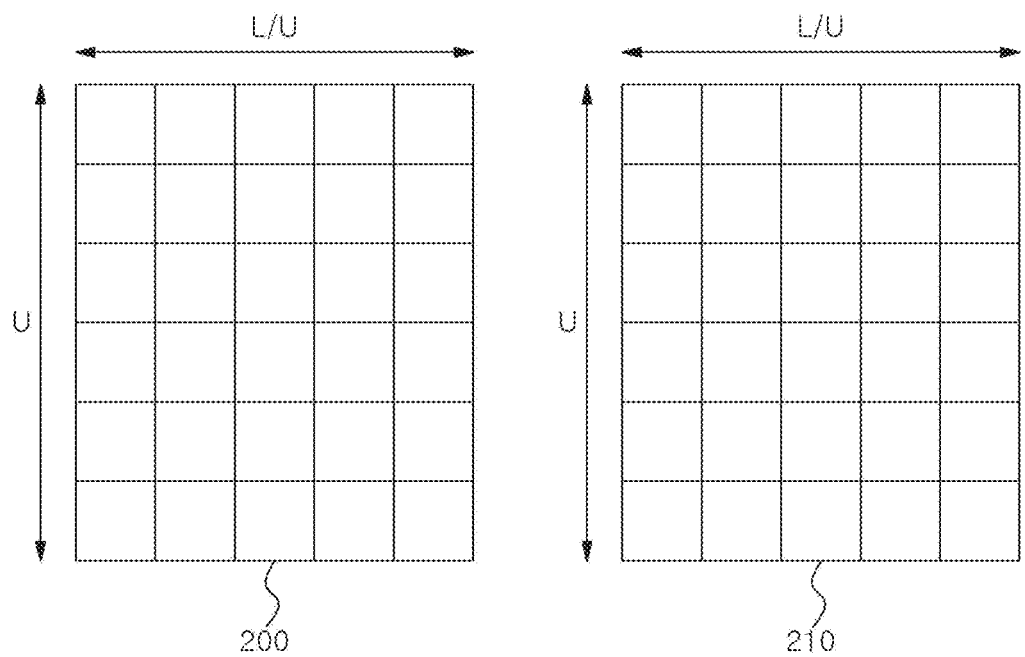
FIG. 2 depicts a diagram illustrating a matrix generator of the signal filtering device according to an embodiment.

FIG. 2 is a diagram illustrating a matrix generator 110 of the signal filtering device 100 according to an embodiment.

Referring to FIG. 2, as an embodiment, the matrix generator 110 may generate a first matrix 200 and a second matrix 210 having first data U as a column and second data L/U as a row, which is a value obtained by dividing the length L of the digital filter bank by the first data U.

In this case, sizes of the first matrix 200 and the second matrix 210 may be the same, and the value of the first data U may be changed according to the setting, but the present disclosure is not limited thereto.

Further, when a matrix is generated, the matrix generator 110 may assign a plurality of digital filter bank filter coefficients or a plurality of input signals to each of one or more matrices, but the present disclosure is not limited thereto.

The memory 120 may store each of one or more matrices generated by the matrix generator 110 to which a plurality of digital filter bank filter coefficients or a plurality of input signals are assigned.

In more detail, the memory 120 may store the first matrix 200 to which a plurality of digital filter bank filter coefficients are assigned, and the second matrix 210 to which a plurality of input signals are assigned, but the present disclosure is not limited thereto.

Hereinafter, the memory 120 will be described in detail with reference to FIG. 3.

Figure 3:
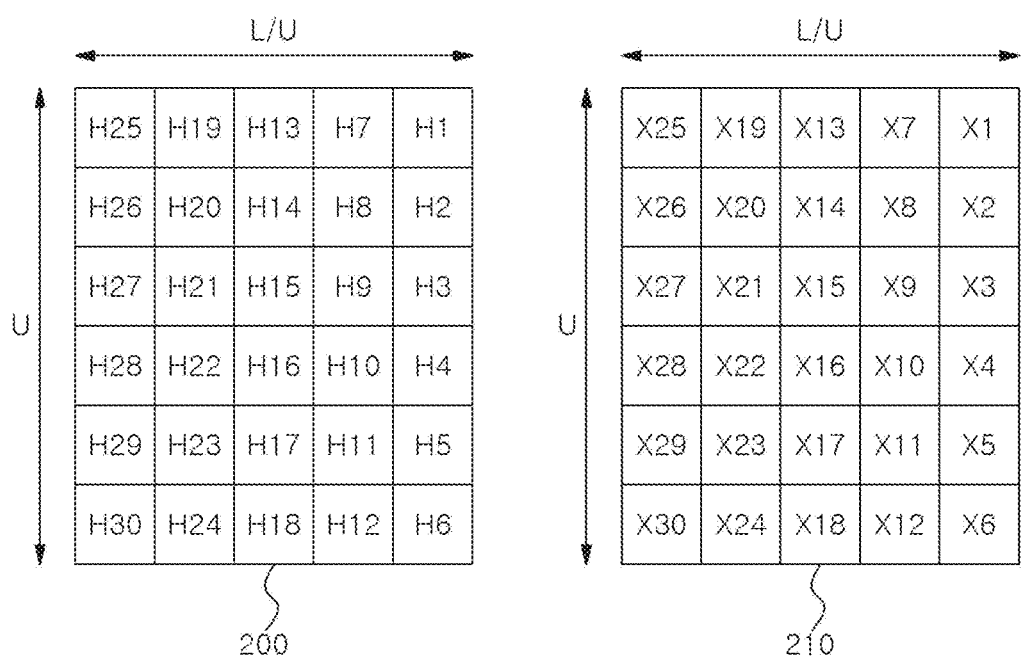
FIG. 3 represents a diagram illustrating a matrix stored in a memory of a signal filtering device according to an embodiment.

FIG. 3 is a diagram illustrating a matrix stored in a memory of a signal filtering device according to an embodiment.

Referring to FIG. 3, in the memory 120, a first matrix 200 to which filter coefficients of a plurality of digital filter banks are assigned may be stored, and a second matrix 210 to which a plurality of input signals (e.g., may be a plurality of signals input to the digital filter bank) input to the signal filtering device 100 are assigned may be stored, but the present disclosure is not limited thereto.

In this case, the plurality of signals may be digital signals converted by passing through an analog-to-digital converter (ADC) before being input to the signal filtering device 100, but the present disclosure is not limited thereto.

As an embodiment, the memory 120 may store a first matrix 200 to which a plurality G of filter coefficients H1, H2 . . . H30 are assigned, and store a second matrix 210 to which a plurality of signals X1, X2 . . . X30 are assigned, and in this case, in each of the first matrix 200 and the second matrix 210, a plurality of filter coefficients H1, H2 . . . H30 or a plurality of signals X1, X2 . . . X30 may be sequentially assigned according to the reference number of the filter coefficient from the right of the matrix (the right of the row and the column of the first matrix and the second matrix), but the present disclosure is not limited thereto.

The signal calculation unit 130 may partially calculate a plurality of stored filter coefficients and a plurality of signals based on the number of at least some channels of the plurality of channels, and calculate the calculated filter coefficients and signals.

In more detail, the signal calculation unit 130 may perform an operation of adding a value obtained by multiplying each of some of a plurality of signals stored in the second matrix 210 and some of the plurality of filter coefficients stored in the first matrix 200 based on the number of channels (e.g., may be at least some channels of the plurality of channels output from the digital filter bank).

Hereinafter, the signal calculation unit 130 will be described in detail with reference to FIGS. 4A and 4B.

Figure 4A:
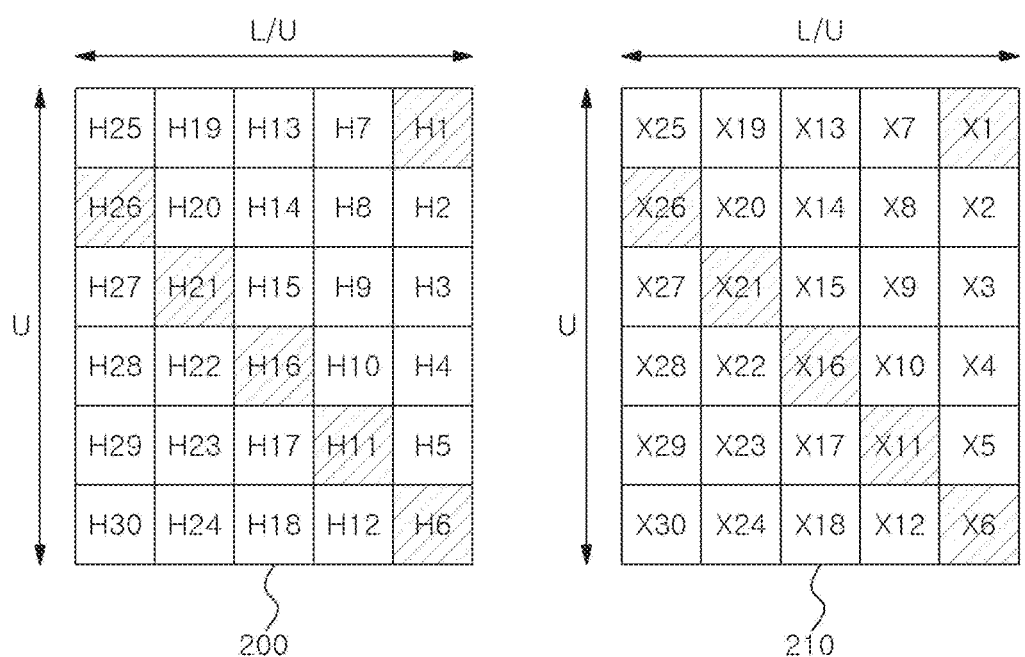
FIGS. 4A and 4B illustrate diagrams illustrating a signal calculation unit of the signal filtering device according to an embodiment.
Figure 4B:
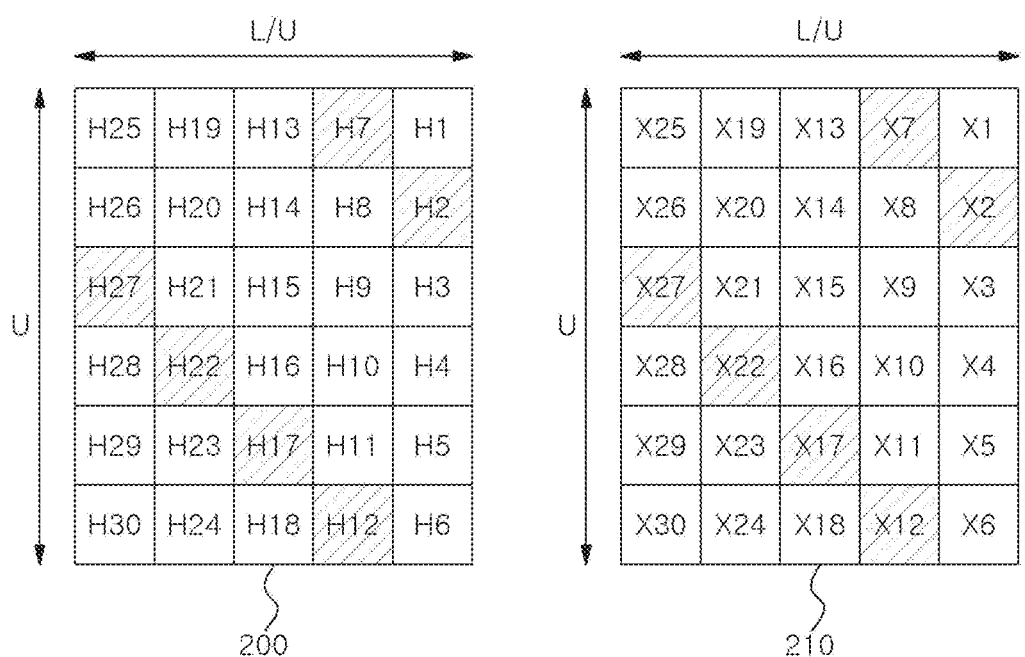

FIGS. 4A and 4B are diagrams illustrating a signal calculation unit of a signal filtering device according to an embodiment.

Referring to FIG. 4A, assuming that the plurality of output channels output from the digital filter bank are 5, the signal calculation unit 130 may calculate some of a plurality of filter coefficients and a plurality of signals in each of the first matrix 200 and the second matrix 210 based on 5.

Further, in FIG. 4A, calculation of a signal of one channel among a plurality of output channels (which will be described assuming five channels) output from the digital filter bank will be described.

For example, when a plurality of filter coefficients are stored from H1 to H30 in the first matrix 200, the signal calculation unit 130 may first calculate the filter coefficient H1 stored in the first matrix 200, and then calculate total six filter coefficients H1, H6, H11, H16, H21, and H26 up to the filter coefficient H26 stored in the first matrix 200 in a method of calculating the filter coefficient H6 stored in the first matrix 200 based on 5 in the calculated filter coefficient H1, but the present disclosure is not limited thereto.

In this case, the signal calculation unit 130 may calculate the filter coefficient H1 stored in the first matrix 200 and then partially calculate a filter coefficient from the first matrix 200 in a method of shifting by one space to the right of the calculated filter coefficient for each row of the first matrix 200.

For example, the signal calculation unit 130 may calculate H1 for a first row of the first matrix 200, calculate H26 shifted by one space to the right from H1 for a second row of the first matrix, and calculate total six filter coefficients H1, H6, H11, H16, H21, and H26 up to H6 in a sixth row of the first matrix in a method of calculating H21 shifted by one space to the right from H26 for a third row of the matrix, but the present disclosure is not limited thereto.

When a plurality of signals are stored from X1 to X30 in the second matrix 210, the signal calculation unit 130 may first calculate the filter coefficient X1 stored in the second matrix 210 and then calculate total 6 signals X1, X6, X11, X16, X21, and X26 up to the signal X26 stored in the second matrix 210 in a method of calculating the signal X6 stored in the second matrix 210 based on 5 in the calculated signal X1, but the present disclosure is not limited thereto.

In this case, the signal calculation unit 130 may calculate the signal X1 stored in the second matrix 210 and then partially calculate the filter coefficient in the second matrix 210 in a method of shifting by one space to the right of the calculated signal for each row of the second matrix 210. For example, the signal calculation unit 130 may calculate X1 for a first row of the second matrix 210, calculate X26 shifted by one space to the right for a second row of the second matrix 210, and calculate total six signals X1, X6, X11, X16, X21, and X26 up to X6 of the sixth row of the second matrix 210 in a method of calculating X21 shifted by one space from X26 to the right for a third row of the second matrix 210, but the present disclosure is not limited thereto.

Furthermore, the signal calculating unit 130 may perform an operation of adding a value obtained by multiplying each of the filter coefficients and signals calculated as in Equation 1.

$$S1 = H1*X1 + H6*X6 + H11*X11 + H16*X16 + H21*X21 + H26*X26 \qquad \text{[Equation 1]}$$

where S1 is a signal calculated by the signal calculation unit 130 for at least some channels (e.g., may be one channel) of a plurality of output channels output from the digital filter bank.

Referring to FIG. 4B, assuming that the plurality of output channels output from the digital filter bank are five, the signal calculation unit 130 may calculate a plurality of filter coefficients and a plurality of signals in each of the first matrix 200 and the second matrix 210 based on 5.

Further, in FIG. 4B, calculation of a signal of two channels among a plurality of output channels (described assuming five channels) output from the digital filter bank will be described.

For example, when a plurality of filter coefficients are stored from H1 to H30 in the first matrix 200, the signal calculation unit 130 may first calculate the filter coefficient H2 stored in the first matrix 200, and then calculate total six filter coefficients H2, H7, H12, H17, H22, and H27 up to the filter coefficient H27 stored in the first matrix 200 in a method of calculating the filter coefficient H7 stored in the first matrix 200 based on 5 in the calculated filter coefficient H2, but the present disclosure is not limited thereto.

In this case, the signal calculation unit 130 may calculate the filter coefficient H7 stored in the first matrix 200, and then partially calculate the filter coefficient in the first matrix 200 in a method of shifting by one space to the right of the calculated filter coefficient for each row of the first matrix 200. For example, the signal calculation unit 130 may calculate H7 for the first row of the first matrix 200, calculate H2 shifted by one space from H7 to the right for the second row of the first matrix 200, and calculate total six filter coefficients H2, H7, H12, H17, H22, and H27 up to H12 of the sixth row of the first matrix 200 in a method of calculating H27 shifted by one space to the right from H2 for the third row of the first matrix 200, but the present disclosure is not limited thereto.

When a plurality of signals are stored from X1 to X30 in the second matrix 210, the signal calculation unit 130 may first calculate the filter coefficient X2 stored in the second matrix 210 and then calculate total 6 signals X2, X7, X12, X17, X22, and X27 up to the signal X27 stored in the second matrix 210 in a method of calculating the signal X7 stored in the second matrix 210 based on 5 in the calculated signal X2, but the present disclosure is not limited thereto.

In this case, the signal calculation unit 130 may calculate the signal X7 stored in the second matrix 210 and then partially calculate the filter coefficient in the second matrix 210 in a method of shifting by one space to the right of the calculated signal in each row of the second matrix 210. For example, the signal calculation unit 130 may calculate X7 for the first row of the second matrix 210, calculate X2 shifted by one space to the right from X7 for the second row of the second matrix 210, and calculate total six signals X2, X7, X12, X17, X22, and X27 up to X12 of the sixth row of the second matrix 210 in a method of calculating X27 shifted by one space to the right from X2 for the third row of the second matrix 210, but the present disclosure is not limited thereto.

Furthermore, the signal calculating unit 130 may perform an operation of adding a value obtained by multiplying each of the filter coefficients and signals calculated as in Equation 2.

$$S2=H2*X2+H7*X7+H12*X12+H17*X17+H22*X22+H27*X27 \quad \text{[Equation 2]}$$

where S2 is a signal calculated by the signal calculating unit 130 for at least some channels (e.g., may be two channels) among the plurality of output channels output from the digital filter bank.

The signal calculation unit 130 may generate the calculated signals S1, S2 . . . as many as the number of a plurality of channels output from the digital filter bank, and for example, when the number of a plurality of channels output from the digital filter bank is 5, five operation signals S1, S2, S3. S4, and S5 may be generated, but the present disclosure is not limited thereto.

The discrete Fourier transform unit 140 may perform a discrete Fourier transform (DFT) on a signal calculated by the signal calculation unit 130.

More specifically, the discrete Fourier transform unit 140 may perform a fast Fourier transform (FFT) in which the discrete Fourier transform is performed at a high speed on the signal calculated by the signal calculation unit 130, but the present disclosure is not limited thereto.

The phase compensation unit 150 may compensate for the phase of the discrete Fourier transformed signal according to a preset reference.

More specifically, the phase compensation unit 150 may compensate for the phase of the discrete Fourier transformed signal through Equation 3.

$$P \cdot \exp(-j2\pi \cdot i \cdot U/W) \quad \text{[Equation 3]}$$

where P is a discrete Fourier transformed signal, i is a channel number of the discrete Fourier transformed signal P, U is first data, and W is the number of at least some channels of the plurality of channels of the digital filter bank.

Furthermore, when the digital filter bank has 5 output channels, 5 discrete Fourier transformed signals are generated, and accordingly, the phase compensation unit 150 may compensate a phase of the 5 discrete Fourier transformed signals to output total five phase-compensated signals, but the present disclosure is not limited thereto.

In compensating for a phase of the discrete Fourier transformed signal in the phase compensation unit 150 based on Equation 3, because a value of the first data U may vary according to the setting, a sample rate of a final output signal obtained by compensating for a phase of the discrete Fourier transformed signal in the phase compensation unit 150 may be also varied to generate a random sample rate.

Further, as a random sample rate is generated, a bandwidth of an output signal (may be an output signal passed through the signal filtering device) passed through the phase compensation unit 150 may be changed according to the sample rate, and accordingly, the output signal may not cause an aliasing phenomenon.

Hereinafter, that an aliasing phenomenon does not occur in an output signal of the signal filtering device 100 according to an embodiment will be described in detail later with reference to FIGS. 5 to 7.

Figure 5:
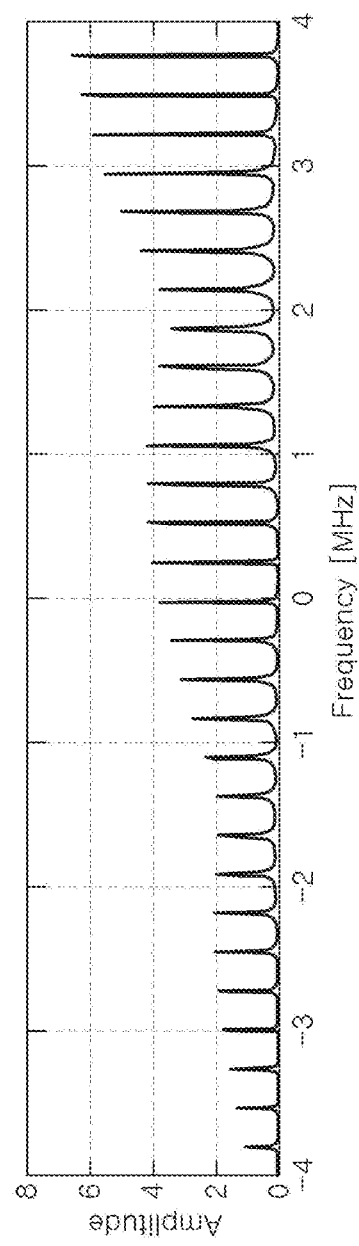
FIG. 5 describes a graph of a frequency component of a signal input to a digital filter bank according to an embodiment.

FIG. 5 is a graph of a frequency component of a signal input to a digital filter bank according to an embodiment.

Assuming a signal of the graph illustrated in FIG. 5 has −4 to 4 MHz and a bandwidth of 8 MHz, the graph is a graph in which a sine wave is input at an interval of 0.27 MHz when the digital filter bank of 8 channels is applied.

Figure 6:
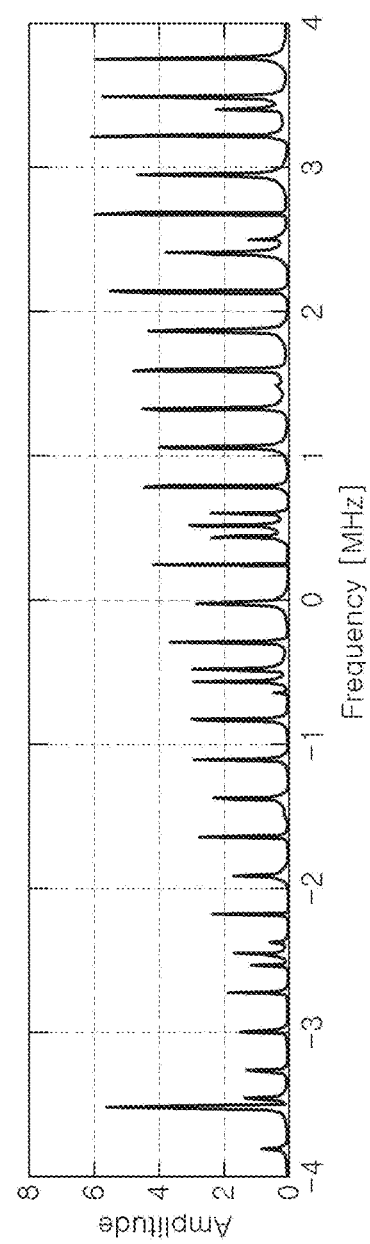
FIG. 6 depicts a graph of a frequency component of an output signal of the signal filtering device based on a conventional polyphase digital filter bank.

FIG. 6 is a graph of a frequency component of an output signal of a signal filtering device based on a conventional polyphase digital filter bank.

Further, it is assumed that the signal filtering device based on the conventional polyphase digital filter bank of FIG. 6 receives a signal of the graph illustrated in FIG. 5.

Referring to FIG. 6, it may be determined that in the output signal of the signal filtering device based on the polyphase digital filter bank, an aliasing phenomenon occurs in a signal component at a boundary of the channel.

Figure 7:
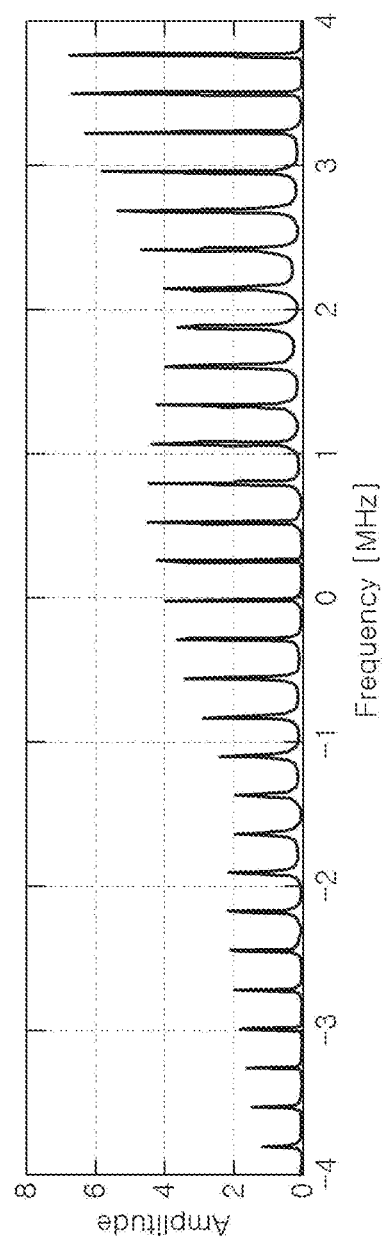
FIG. 7 represents a graph of a frequency component of an output signal of the signal filtering device based on a digital filter bank according to an embodiment.

FIG. 7 is a graph of a frequency component of an output signal of a signal filtering device based on a digital filter bank according to an embodiment.

In this case, it is assumed that the signal filtering device 100 based on the digital filter bank according to an embodiment of FIG. 7 receives a signal of the graph illustrated in FIG. 5.

Referring to FIG. 7, when compared with the graph illustrated in FIG. 5, in the output signal of the signal filtering device 100 based on the digital filter bank according to an embodiment, it may be determined that no aliasing phenomenon has occurred.

However, because the polyphase digital filter bank has a fixed channel bandwidth by performing fixed channelization, there is a problem that an aliasing phenomenon occurs in an output signal passing through the polyphase digital filter bank.

However, the signal filtering device 100 according to an embodiment differently applies a value U of first data according to the setting instead of having a fixed channel bandwidth, and thus because a random bandwidth may be set through a value B/U obtained by dividing a bandwidth B of an input signal by the value of the first data U, an output signal (may be an output signal passing through the digital filter bank) passing through the signal filtering device 100 according to an embodiment has a random bandwidth and thus an aliasing phenomenon may not occur as illustrated in the graph of FIG. 7.

Further, in the case of a conventional digital filter bank, 2,064 signal calculations are required for 1 sample output, whereas because the signal filtering device 100 based on the digital filter bank according to an embodiment requires 132 signal calculations for 1 sample output, an amount of signal calculation is relatively reduced and thus the digital filter bank can be easily implemented.

Figure 8:
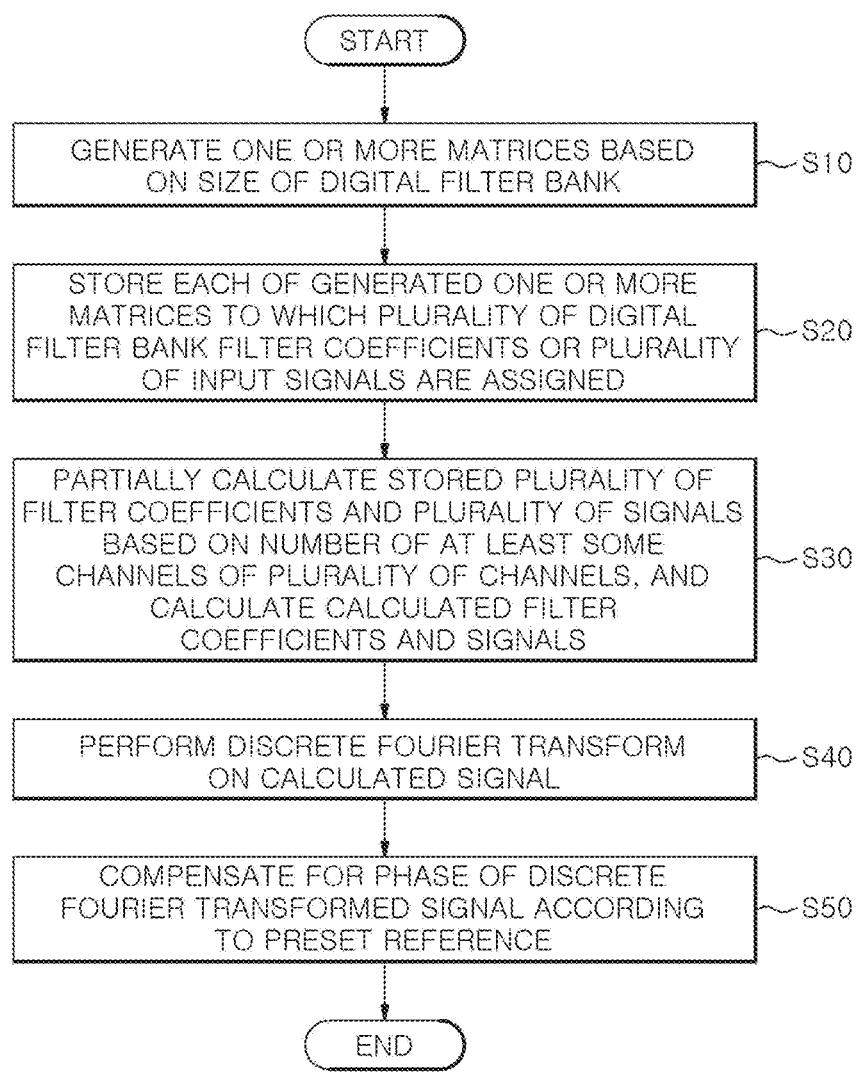
FIG. 8 illustrates an exemplary flowchart of a signal filtering method according to an embodiment.

FIG. 8 is an exemplary flowchart of a signal filtering method according to an embodiment. The signal filtering method illustrated in FIG. 8 may be performed by the signal filtering device 100 illustrated in FIG. 1. Further, the signal filtering method illustrated in FIG. 8 is only an example.

First, the matrix generator 110 may generate one or more matrices based on a size of a digital filter bank that generates an output signal by dividing an input signal into a plurality of channels (step S10).

As an embodiment, the matrix generator 110 may generate a first matrix 200 and a second matrix 210 having first data U as a column and the second data L/U as a row, which is a value obtained by dividing a length L of the digital filter bank by the first data U, but the present disclosure is not limited thereto.

Further, when a matrix is generated, the matrix generator 110 may assign a plurality of digital filter bank filter coefficients or a plurality of input signals to each of one or more matrices, but the present disclosure is not limited thereto.

The memory 120 may store each of the generated one or more matrices to which a plurality of digital filter bank filter coefficients or a plurality of input signals are assigned (step S20).

More specifically, the memory 120 may store a first matrix 200 to which a plurality of digital filter bank filter coefficients are assigned, and a second matrix 210 to which a plurality of input signals are assigned, but the present disclosure is not limited thereto.

The signal calculating unit 130 may partially calculate the stored plurality of filter coefficients and the plurality of signals based on the number of at least some channels of the plurality of channels, and calculate the calculated filter coefficients and signals (step S30).

More specifically, the signal calculation unit 130 may perform an operation of adding a value obtained by multiplying each of some of the plurality of filter coefficients stored in the first matrix 200 and some of a plurality of signals stored in the second matrix 210 based on the number of channels (at least some channels of the plurality of channels).

The discrete Fourier transform unit 14 may perform a discrete Fourier transform (DFT) for the signal calculated by the signal calculation unit 130 (step S40).

More specifically, the discrete Fourier transform unit 140 may perform a fast Fourier transform (FFT) that performs a discrete Fourier transform at high speed, but the present disclosure is not limited thereto.

The phase compensation unit 150 may compensate for a phase of the discrete Fourier transformed signal according to a preset reference (step S50).

In more detail, the phase compensation unit 150 may compensate for the phase of the discrete Fourier transformed signal based on the product of the discrete Fourier transformed signal and exp(−j2π·i·U/W), where i is a channel number of the discrete Fourier transformed signal, U is the first data, and W is the number of channels.

As described abo % e, the signal filtering device according to an embodiment is the signal filtering device based on the digital filter bank, and has a relatively small amount of signal calculation (e.g., may be less than an amount of signal calculation of a conventional general digital filter bank), thereby reducing the complexity in implementing a digital filter bank.

Further, the signal filtering device according to an embodiment may have a random sample rate by varying a sample rate according to the setting of a first data value, which is a G column of a matrix generated through the matrix generator, and accordingly, because signal processing may be performed to have a sampling frequency of a Nyquist rate or more, an aliasing phenomenon mas not occur.

Further, the method of the present disclosure described previously may be implemented in a computer-readable storage medium including a computer program instructions to perform respective steps included in the method or implemented in the computer program instructions, included in the computer-readable storage medium, to perform respective steps included in the method.

The above description illustrates the technical idea of the present disclosure, and it will be understood by those skilled in the art to which this present disclosure belongs that various changes and modifications may be made without departing from the scope of the essential characteristics of the present disclosure. Therefore, the exemplary embodiments disclosed herein are not used to limit the technical idea of the present disclosure, but to explain the present disclosure, and the scope of the technical idea of the present disclosure is not limited by those embodiments. Therefore, the scope of protection of the present disclosure should be construed as defined in the following claims, and all technical ideas that fall within the technical idea of the present disclosure are intended to be embraced by the scope of the claims.

What is claimed is:

1. A signal filtering device, comprising:
a memory; and
a processor in data communication with the memory and configured to:
generate one or more matrices based on a size of a digital filter bank that generates an output signal by dividing an input signal into a plurality of channels, the one or more matrices comprising a first matrix and a second matrix, each of the first and second matrices comprising a plurality of rows;
store in the memory the first matrix to which a plurality of digital filter bank coefficients are assigned and the second matrix to which a plurality of input signals are assigned;
partially select two or more digital filter bank coefficients from the plurality of digital filter bank coefficients of the first matrix based on a number of at least some of the plurality of channels such that only a portion of digital filter bank coefficients in each row of the first matrix is selected;
calculate the selected two or more digital filter bank coefficients;
partially select two or more input signals from the plurality of input signals of the second matrix based on the number of the at least some of the plurality of channels such that only a portion of input signals in each row of the second matrix is selected;
separately calculate the selected two or more input signals;
calculate a signal based on the calculated two or more digital filter bank coefficients and the separately calculated two or more input signals;

perform a discrete Fourier transform (DFT) on the calculated signal; and compensate for a phase of the discrete Fourier transformed signal according to a preset reference.

2. The signal filtering device of claim 1, wherein the processor is further configured to generate a first matrix and a second matrix having first data as a column and second data as a row, which is a value obtained by dividing a length of the digital filter bank by the first data.

3. The signal filtering device of claim 2, wherein the processor is further configured to add a value obtained by multiplying each of some of the plurality of digital filter bank coefficients stored in the first matrix and some of the plurality of signals stored in the second matrix based on the number of channels.

4. The signal filtering device of claim 1, wherein the processor is further configured to generate the calculated signal as much as the number of channels.

5. The signal filtering device of claim 1, wherein the DFT comprises a fast Fourier transform (FFT).

6. The signal filtering device of claim 2, wherein the processor is further configured to compensate for a phase of the discrete Fourier transformed signal based on the product of the discrete Fourier transformed signal and $\exp(-j2\pi \cdot i \cdot U/W)$, wherein the i is a channel number of the discrete Fourier transformed signal, wherein the U is the first data, and wherein the W is the number of channels.

7. The signal filtering device of claim 2, wherein the processor is further configured to adjust a sample rate for adjusting a bandwidth of the output signal according to a value of the first data.

8. The signal filtering device of claim 1, wherein, in partially selecting the two or more digital filter bank coefficients, the processor is configured to:

select a first digital filter bank coefficient from a first row of the first matrix; and select a second digital filter bank coefficient from a second row of the first matrix by shifting, from the first digital filter bank coefficient, one space to the right and one row down in the first matrix.

9. The signal filtering device of claim 1, wherein, in partially selecting the two or more input signals, the processor is configured to:

select a first input signal from a first row of the second matrix; and select a second input signal from a second row of the second matrix by shifting, from the first input signal, one space to the right and one row down in the second matrix.

10. A method of filtering a signal using a signal filtering device, the method comprising:

generating, at a processor of the signal filtering device, one or more matrices based on a size of a digital filter bank that generates an output signal by dividing an input signal into a plurality of channels, the one or more matrices comprising a first matrix and a second matrix, each of the first and second matrices comprising a plurality of rows;

storing, at the processor, the first matrix to which a plurality of digital filter bank coefficients are assigned and the second matrix to which a plurality of input signals are assigned;

partially selecting two or more digital filter bank coefficients from the plurality of digital filter bank coefficients of the first matrix based on a number of at least some of the plurality of channels such that only a portion of digital filter bank coefficients in each row of the first matrix is selected;

calculating the selected two or more digital filter bank coefficients;

partially selecting two or more input signals from the plurality of input signals of the second matrix based on the number of the at least some of the plurality of channels such that only a portion of input signals in each row of the second matrix is selected;

separately calculating the selected two or more input signals;

calculating, at the processor, a signal based on the calculated two or more digital filter bank coefficients and the separately calculated two or more input signals;

performing, at the processor, a discrete Fourier transform (DFT) on the calculated signal; and compensating, at the processor, for a phase of the discrete Fourier transformed signal according to a preset reference.

11. The method of claim 10, wherein the generating comprises generating a first matrix and a second matrix having first data as a column and second data as a row, which is a value obtained by dividing a length of the digital filter bank by the first data.

12. The method of claim 11, wherein the calculating comprises adding a value obtained by multiplying each of some of the plurality of digital filter bank coefficients stored in the first matrix and some of the plurality of signals stored in the second matrix based on the number of channels.

13. The method of claim 10, wherein the calculating comprises generating the calculated signal as much as the number of channels.

14. The method of claim 10, wherein the DFT comprises a fast Fourier transform (FFT).

15. The method of claim 11, wherein the compensating is performed based on the product of the discrete Fourier transformed signal and $\exp(-j2\pi \cdot i \cdot U/W)$, wherein the i is a channel number of the discrete Fourier transformed signal, wherein the U is the first data, and wherein the W is the number of channels.

16. The method of claim 11, further comprising adjusting a sample rate for adjusting a bandwidth of the output signal according to a value of the first data.

17. A non-transitory computer readable recording medium storing a computer program, wherein the computer program, when executed by a processor, comprises instructions for enabling the processor to perform a method of filtering a signal using a signal filtering device, the method comprising:

generating, at a processor of the signal filtering device, one or more matrices based on a size of a digital filter bank that generates an output signal by dividing an input signal into a plurality of channels, the one or more matrices comprising a first matrix and a second matrix, each of the first and second matrices comprising a plurality of rows;

storing, at the processor, the first matrix to which a plurality of digital filter bank coefficients are assigned and the second matrix to which a plurality of input signals are assigned;

partially selecting two or more digital filter bank coefficients from the plurality of digital filter bank coefficients of the first matrix based on a number of at least some of the plurality of channels such that only a portion of digital filter bank coefficients in each row of the first matrix is selected;

calculating the selected two or more digital filter bank coefficients;

partially selecting two or more input signals from the plurality of input signals of the second matrix based on the number of the at least some of the plurality of channels such that only a portion of input signals in each row of the second matrix is selected;

separately calculating the selected two or more input signals;

calculating, at the processor, a signal based on the calculated two or more digital filter bank coefficients and the separately calculated two or more input signals;

performing, at the processor, a discrete Fourier transform (DFT) on the calculated signal; and compensating, at the processor, for a phase of the discrete Fourier transformed signal according to a preset reference.

18. The signal filtering device of claim 8, wherein the processor is further configured to select a third digital filter bank coefficient from a third row of the first matrix by shifting, from the second digital filter bank coefficient, one space to the right and one row down in the first matrix.

19. The signal filtering device of claim 9, wherein the processor is further configured to select a third input signal from a third row of the second matrix by shifting, from the second input signal, one space to the right and one row down in the second matrix.

* * * * *